United States Patent [19]
Kitamura et al.

[11] Patent Number: 5,760,440
[45] Date of Patent: Jun. 2, 1998

[54] BACK-SOURCE MOSFET

[75] Inventors: Akio Kitamura; Naoto Fujishima. both of Nagano. Japan

[73] Assignee: Fuji Electric Co., Ltd., Kawasaki, Japan

[21] Appl. No.: 604,331

[22] Filed: Feb. 21, 1996

[30] Foreign Application Priority Data

Feb. 21, 1995 [JP] Japan ................................. 7-031284

[51] Int. Cl.$^6$ ................................................ H01L 29/76
[52] U.S. Cl. .................. 257/328; 257/329; 257/330; 257/334; 257/336; 257/492; 257/493
[58] Field of Search ............................. 257/327, 328, 257/329, 330, 334, 336, 337, 338, 491, 492, 493

[56] References Cited

U.S. PATENT DOCUMENTS

| | | | |
|---|---|---|---|
| 5,040,045 | 8/1991 | McArthur et al. | 257/491 |
| 5,473,176 | 12/1995 | Kakumoto | 257/330 |

FOREIGN PATENT DOCUMENTS

| | | |
|---|---|---|
| 5110080 | 4/1993 | Japan . |
| 590579 | 4/1993 | Japan . |
| 5121739 | 5/1993 | Japan . |

OTHER PUBLICATIONS

"MOSFET with a Low Resistance in ON State Realizing Power LSI", Electron Device and Semiconductor Power Conversion Joint Research Group of the Institute of Electrical Engineers of Japan, Oct. 29, 1992. (abs).

Daisuke Ueda et al., An Ultra-Low On-Resistance Power MOSFET Fabricated by Using a Fully Self-Aligned Process, IEEE Transactions on Electron Devices, vol. ED-34, No. 4, Apr. 1987.

H.R. Chang et al., Self-Aligned UMOSFET's with a Specific On-Resistance of 1 m$\Omega$ · cm$^2$, IEEE Transactions on Electron Devices, vol. ED-34, No. 11, Nov. 1987.

*Primary Examiner*—Minh-Loan Tran
*Attorney, Agent, or Firm*—Morrison Law Firm

[57] ABSTRACT

A back-source MOSFET uses a source electrode on a second surface of a substrate to reduce noise which would otherwise interfere with the logic circuit of a power integrated circuit. One embodiment includes a substrate of a first conductivity type and a base layer of a second conductivity type on a first surface of the substrate. A source region is electrically connected with the substrate. A source electrode is formed on a second surface of the substrate. A further embodiment includes a substrate of a first conductivity type and a base layer of a first conductivity type on a first surface of the substrate. A source electrode is formed on a second surface of the substrate.

20 Claims, 7 Drawing Sheets

5,760,440

1
BACK-SOURCE MOSFET

BACKGROUND OF THE INVENTION

The present invention relates to high-breakdown-voltage power MOSFET's (field-effect transistors having a metal-oxide film-semiconductor structure) used as power devices in power IC's or as discrete devices.

Today, much attention has been focused on power IC's which mount high-breakdown-voltage power devices and a logic circuit for controlling the power devices on one single chip.

Referring to FIG. 10, a cross section of a power IC according to the prior art is shown. In FIG. 10, a part of a lateral MOSFET of a power device circuit 1015 is shown on the left hand side. A CMOS transistor of a logic circuit 1014 is shown on the right hand side. The power device circuit 1015 and the logic circuit 1014 are formed in an n⁻ base layer 1020 grown epitaxially on a p⁺ substrate 1018. In some devices, an n⁺ buried region 1019 is formed as shown in FIG. 10, between the p⁺ substrate 1018 and the n⁻ base layer 1020.

On the left hand side of FIG. 10, a p-type base region 1002 is formed in the n⁻ base layer 1020. An n⁺ source region 1004 is formed in the p-type base region 1002. Spaced from the p-type base region 1002, an n-type drain drift region 1005 is also formed in the n⁻ base layer 1020. An n⁺ drain region 1006 is formed in the n-type drain drift region 1005. A poly-crystalline silicon gate electrode 1007 is formed on a gate oxide film 1008 formed on the portion of the p-type base region 1002 extending between the n⁺ source region 1004 and the n⁻ base layer 1020. An aluminum alloy source electrode 1010 is connected to the n⁺ source region 1004. An aluminum alloy drain electrode 1011 is connected to the n⁺ drain region 1006. The gate electrode 1007 is extended onto a thick LOCOS film 1009 formed on the n-type drain drift region 1005. The gate electrode 1007 is covered with an insulation film 1012 of phosphorus silicate glass (PSG) etc., and insulated from the source electrode 1010.

In the logic circuit 1014, a p⁺ source region 1021 and a p⁺ drain region 1022 are formed in the n⁻ base layer 1020. A source electrode 1031 is connected to the p⁺ source region 1021. A drain electrode 1032 is connected to the p⁺ drain region 1022. A gate electrode 1023 is formed on a gate oxide film 1029. The n⁻ base layer 1020, the p⁺ source region 1021, the p⁺ drain region 1022, the source electrode 1031, the drain electrode 1032, and the gate electrode 1023 constitute a p-channel MOSFET.

A p-type well region 1027 is formed in the n⁻ base layer 1020. An n⁺ source region 1024 and an n⁺ drain region 1025 are formed in the p-type well region 1027. A source electrode 1033 is connected to the n⁺ source region 1024. A drain electrode 1034 is connected to the n⁺ drain region 1025. A gate electrode 1026 is formed on the gate oxide film 1029.

The n⁻ base layer 1020, the source region 1024, the drain region 1025, the source electrode 1033, the drain electrode 1034, and the gate electrode 1026 constitute an n-channel MOSFET. The p-channel MOSFET and the n-channel MOSFET constitute a CMOS circuit. The power IC of FIG. 10 controls the output of the power device circuit 1015 based on the operational results of the logic circuit 1014.

Referring to FIG. 11, a cross section of another power IC according to the prior art is shown. In FIG. 11, a part of a vertical MOSFET of a power device circuit 1115 is shown on the left hand side. A CMOS transistor of a logic circuit 1114 is shown on the right hand side. The power device

2 circuit 1115 and the logic circuit 1114 are formed in an n⁻ base layer 1120 laminated on an n⁺ substrate 1101. On the left hand side of FIG. 11, a p-type base layer 1102 is formed in the n⁻ base layer 1120. An n⁺ source region 1104 is formed in the p-type base layer 1102. A trench 1113 is formed from the surface of the n⁺ source region 1104 down to the n⁻ base layer 1120. A gate electrode 1107, oppositely facing the exposed side face of the p-type base layer 1102 through a gate oxide film 1108, is formed in the trench 1113. An aluminum alloy source electrode 1110 contacts with the n⁺ source region 1104. A drain electrode 1111 contacts with the back surface of the n⁺ substrate 1101. The gate electrode 1107 is covered with an insulation film 1112 of phosphorus silicate glass (PSG) etc., and insulated from the source electrode 1110.

This power device circuit is known as a "vertical MOSFET" in that the source electrode 1110 and the drain electrode 1111 are disposed on the respective major surfaces of the semiconductor wafer, and a current flows in the thickness direction thereof. Since a CMOS circuit is formed in the logic circuit 1114, in almost the same manner as in FIG. 10, by p- and n-channel MOSFET's, the explanation of the logic circuit 1114 is omitted.

Since the source electrode 1110 and the drain electrode 1111 of the MOSFET are separately disposed on the respective major surfaces of the semiconductor substrate in the power device circuit 1115 of FIG. 11, and since a channel is created beneath the inner surface of the trench 1113, the vertical MOSFET of FIG. 11 facilitates integrating more constituent device units and increasing the current capacity per unit area of the semiconductor substrate surface.

There are two ways of designing the power IC's. One way of designing puts its standpoint on the high-breakdown-voltage device. Another way of designing puts its standpoint on the power IC. The power IC of FIG. 10 is designed from the standpoint of the high-breakdown-voltage device. Since the source electrode 1010 and the drain electrode 1011 of the power device circuit 1015 are formed on one surface of the semiconductor substrate, the wiring is complicated, the carriable current is not increased and the on-resistance is not reduced as much as desired.

The power IC of FIG. 11 is designed from the standpoint of the power IC. Since the source electrode 1110 and the drain electrode 1111 are separated on the respective major faces of the semiconductor substrate, complicated wiring may be avoided. Since the current capacity per unit area of the semiconductor substrate can be increased by high density integration, the carriable current is increased and the on-resistance is reduced. However, since the logic circuit 1114 is formed in an isolated island formed in parallel to the vertical MOSFET of the power device circuit 1115, the semiconductor substrate of the logic circuit 1114 is used in common with the drain region of the power device circuit 1115. Because of this structure, noise may be caused in the logic circuit 1114 by the change in the drain voltage.

OBJECTS AND SUMMARY OF THE INVENTION

Accordingly, an object of the present invention is to overcome the drawbacks and limitations of the prior art.

An object of the present invention is to provide a MOSFET that has a structure suited for increasing carriable current.

Another object of the present invention is to provide a MOSFET that has a structure suited for reducing on-resistance.

A still further object of the present invention is to provide a MOSFET that avoids noise generation in the logic circuit of the power IC.

Briefly stated, a back-source MOSFET uses a source electrode on a second surface of a substrate to reduce noise which would otherwise interfere with the logic circuit of a power integrated circuit. One embodiment includes a substrate of a first conductivity type and a base layer of a second conductivity type on a first surface of the substrate. A source region is electrically connected with the substrate. A source electrode is formed on a second surface of the substrate. A further embodiment includes a substrate of a first conductivity type and a base layer of a first conductivity type on a first surface of the substrate. A source electrode is formed on a second surface of the substrate.

According to an embodiment of the present invention, a back-source MOSFET includes a semiconductor substrate of a first conductivity type, a base layer of a second conductivity type on a first surface of the semiconductor substrate, a source region of the first conductivity type in the base layer, the source region extending in the base layer to contact the semiconductor substrate, a drain drift region of the first conductivity type in the base layer, a drain region of the first conductivity type in the drain drift region, a gate electrode on a portion of the base layer, a gate insulation film interposed between the portion of the base layer extending between the source region and the drain drift region, a drain electrode connected to the drain region, a source electrode on a second surface of the semiconductor substrate, and the source electrode being connected to the source region.

According to a feature of the present invention, the source region may be a diffusion layer extending from the surface of the base layer to the semiconductor substrate. Also, the back-source MOSFET is provided with a trench formed from the surface of the source region, and a diffusion layer formed by diffusing impurity ions from the inner face of the trench. The source region and the semiconductor substrate are connected with one another via the diffusion layer.

According to a further feature of the present invention, the back-source MOSFET may be further provided with a conductor filled in the trench. The source region and the semiconductor substrate are connected with one another via the conductor.

According to a still further feature of the present invention, the source region and the semiconductor substrate may also be connected with the base layer via the conductor. Also, an insulation film may be formed on at least a part of the boundary between the semiconductor substrate and the base layer.

According to an embodiment of the present invention, a back-source MOSFET includes a semiconductor substrate of a first conductivity type, a base layer of a second conductivity type on a first surface of the semiconductor substrate, a drain drift region of the first conductivity type on the base layer, a drain region on the drain drift region, a trench from a surface of the drain region at least to the semiconductor substrate, a gate electrode in the trench, a gate oxide film between the gate electrode and the base layer, the gate electrode and the base layer facing opposite surfaces of the gate oxide film, a source electrode on a second surface of the semiconductor substrate, and a drain electrode connected to the drain region.

According to another feature of the present invention, the back-source MOSFET may further be provided with a conductor buried in the trench. The semiconductor substrate and the base layer are connected with one another via the conductor.

According to an embodiment of the present invention, a back-source MOSFET includes a semiconductor substrate of a first conductivity type, a base layer of the first conductivity type on a first surface of the semiconductor substrate, a drain drift region of the first conductivity type on the base layer, a drain region on the drain drift region, a trench from a surface of the drain region at least to the semiconductor substrate, a gate electrode in the trench, a gate oxide film between the gate electrode and the base layer, the gate electrode and the base layer facing opposite surfaces of the gate oxide film, a source electrode on a second surface of the semiconductor substrate, and a drain electrode connected to the drain region.

According to a further feature of the present invention, a CMOS logic circuit may be formed in the base layer.

In the back-source MOSFET in which the source region of the first conductivity type is connected with the semiconductor substrate of the first conductivity type and the source electrode is formed on the second surface (back surface) of the semiconductor substrate, the source and drain electrodes are separated from one another onto the respective major surfaces of the semiconductor substrate. The potential thereof is set at the source potential. The substrate potential is stabilized by the source electrode formed on the back surface of the semiconductor substrate. Accordingly, the potential thereof does not change.

By forming the source layer of the first conductivity type from the surface of the base layer of the second conductivity type down to the semiconductor substrate of the first conductivity type, the source region is connected with the semiconductor substrate. The source electrode may be formed on the back surface of the semiconductor substrate. By forming a trench from the surface of the source layer of the first conductivity type, or by further burying a conductor in the trench for connecting the source region of the first conductivity type and the semiconductor substrate of the first conductivity type, the source electrode may be formed on the back surface of the semiconductor substrate.

By further connecting the source region and the semiconductor substrate with the base layer of the second conductivity type through the conductor buried in the trench, it is not necessary to provide the back-source MOSFET with a separate means for electrically connecting the base layer with the source region and the semiconductor substrate. By forming an insulation film at least on a part of the boundary between the semiconductor substrate and the base layer, the influence of the substrate potential of the back-source MOSFET is reduced. Also, the potential of the CMOS in the logic circuit is stabilized.

In the back-source MOSFET in which a base layer of a second conductivity type is formed on the first surface of a semiconductor substrate of a first conductivity type and a trench is formed from a surface of a drain region down to the semiconductor substrate, the source and drain electrodes are separated from one another onto the respective major surfaces of the semiconductor substrate. By forming the source electrode on the back surface of the semiconductor substrate, the substrate potential is stabilized. The potential thereof does not change.

By burying a conductor in the trench for connecting the semiconductor substrate of the first conductivity type and the base layer of the second conductivity type, it is not necessary to provide the back-source MOSFET with a separate short-circuit means.

By replacing the base layer of the second conductivity type by a base layer of the first conductivity type, a depletion-type MOSFET is obtained. By forming a CMOS logic circuit in the base layer, the substrate potential does not cause noise in the CMOS logic circuit.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Now the present invention will be explained hereinafter with reference to the accompanied drawings which illustrate the preferred embodiments of the present invention. Since the present invention is applicable to a discrete MOSFET, even though the present embodiments will be described exemplarily on the power devices integrated into a power IC, only the MOSFET circuit will be described in some embodiments. Since the MOSFET's of the invention are featured by the source electrode disposed on the back surface of the semiconductor substrate, the MOSFET of the invention is named "back-source MOSFET".

Figure 1:
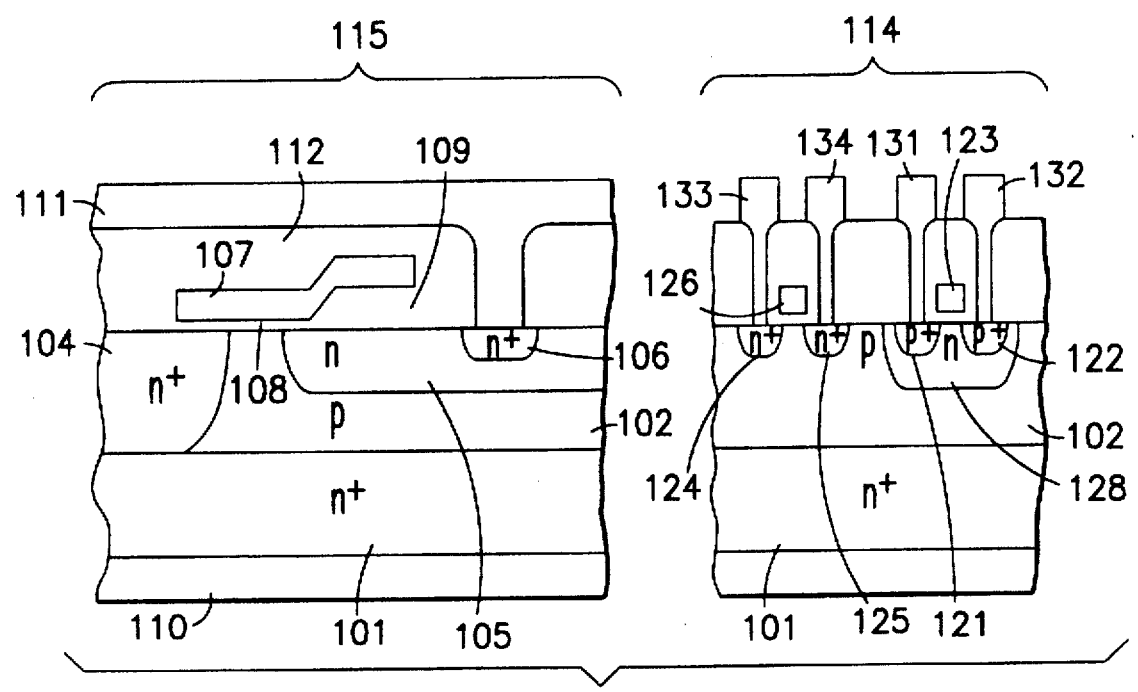
FIG. 1 is a cross section of a power IC into which a first embodiment of a back-source MOSFET according to the present invention is incorporated.

Referring to FIG. 1, a cross section of a power IC into which a first embodiment of a back-source MOSFET according to the present invention is incorporated is shown. In FIG. 1, a part of a lateral MOSFET of a power device circuit 115 is shown on the left hand side. A CMOS transistor of a logic circuit 114 is shown on the right hand side.

The power device circuit 115 and the logic circuit 114 are formed in a p-type base layer 102, with an impurity concentration of around $5\times10^{16}$ cm$^3$ and around 4 µm in thickness, laminated epitaxially on an n$^+$ substrate 101 with an impurity concentration of around $1\times10^{20}$ cm$^3$. On the left hand side of FIG. 1, an n$^+$ source region 104 is formed from the surface of the p-type base layer 102 as deep as the n$^+$ substrate 101. An n-type drain drift region 105, shallower than and spaced from the n$^+$ source region 104, is formed in the p-type base layer 102. An n$^+$ drain region 106 is formed from a part of the surface of the n-type drain drift region 105. A poly-crystalline silicon gate electrode 107 is formed on a portion of the p-type base layer 102 with a gate oxide film 108 interposed in-between. The portion of the p-type base layer 102 extends between the n$^+$ source region 104 and the n-type drain drift region 105. The gate electrode 107 is extended onto a thick oxide film (LOCOS) 109 on the side near to the n$^+$ drain region 106. Thus, an n-channel MOSFET is formed.

In the logic circuit 114, an n$^+$ source region 124 and an n$^+$ drain region 125 are formed in the p-type base layer 102. A source electrode 133 is connected to the n$^+$ source region 124. A drain electrode 134 is connected to the n$^+$ drain region 125. The p-type base layer 102, the n$^+$ source region 124, the n$^+$ drain region 125, the source electrode 133, the drain electrode 134, and a gate electrode 126 constitute an n-channel MOSFET.

An n-type well region 128 is formed in the p-type base layer 102. A p$^+$ source region 121 and a p$^+$ drain region 122 are formed in the n-type well region 128. A source electrode 131 is connected to the p$^+$ source region 121. A drain electrode 132 is connected to the p$^+$ drain region 122. The n-type well region 128, the p$^+$ source region 121, the p$^+$ drain region 122, the source electrode 131, the drain electrode 132, and a gate electrode 123 constitute a p-channel MOSFET. The p-channel MOSFET and the n-channel MOSFET constitute a CMOS circuit.

In driving the power IC of FIG. 1, a positive voltage is applied to the gate electrode 107 of the power device circuit 115 based on the operational result generated by the CMOS transistor circuit of the logic circuit 114. Then, a channel is created beneath the surface of the portion of the p-type base layer 102 extending between the n$^+$ source region 104 and the n-type drain drift region 105. The output current flowing from the drain electrode 111 to the source electrode 110 is controlled by the creation of the channel.

Since the n$^+$ source region 104 is diffused as deep as 5 µm, and since the n$^+$ source region 104 and the n$^+$ substrate 101 are electrically connected completely with one another, the aluminum alloy film deposited on the entire back surface of the n$^+$ substrate 101 functions as the source electrode 110. The drain electrode 111 is formed, in contact with the n$^+$ drain region 106, over the entire top surface of the n$^+$ substrate 101. Thus, by forming the source electrode 110 and the drain electrode 111 respectively on the back and top surfaces of the n$^+$ substrate 101, the wiring area is increased, the wiring resistance is reduced greatly, and the on-resistance of the MOSFET is lowered. Moreover, by forming a radiator plate (not shown) on the source electrode 110 formed on the n$^+$ substrate 101, a large current output comparable to that from the usual discrete devices is realized.

The CMOS constituting the logic circuit 114 is formed on the p-type base layer 102 as shown in FIG. 1. The n$^+$ substrate 101, that is also the source of the n-channel MOSFET of the power device circuit 115, is fixed at ground potential, when used on a low voltage side such as in the H-bridge circuit, inverter circuit, etc. Due to this potential scheme, the potential of the p-type base layer 102, that is the substrate of the logic circuit 114, is stabilized to prevent noise from being caused in the logic circuit 114.

Figure 2:
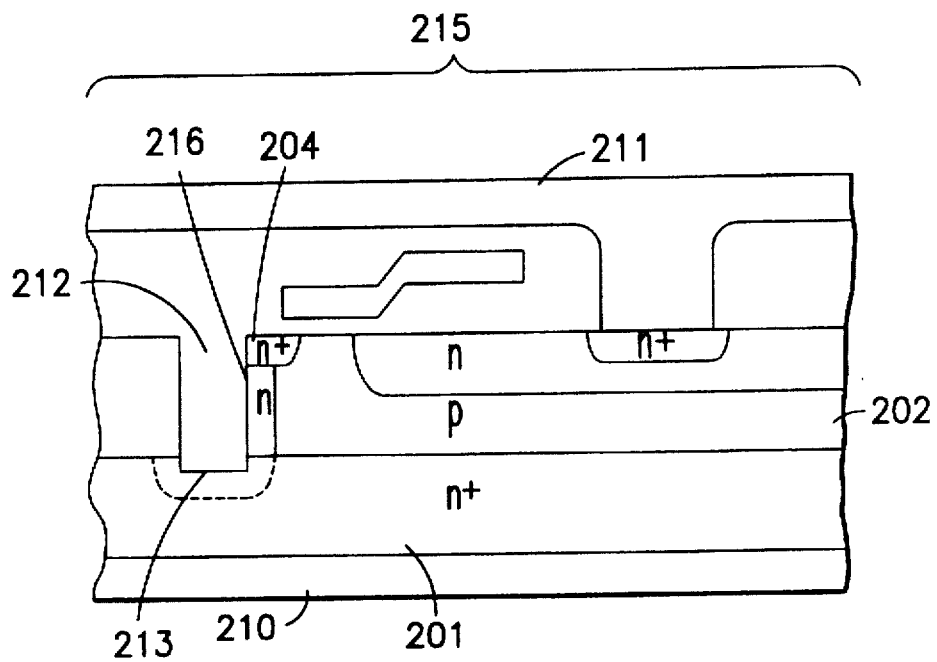
FIG. 2 is a cross section of a second embodiment of a back-source MOSFET according to the present invention.

Referring to FIG. 2, a cross section of a second embodiment of a back-source MOSFET is shown. In a power device circuit 215 shown in FIG. 2, a shallow n$^+$ source region 204 is formed, in place of the deep n$^+$ source region 104 of the first embodiment, from the surface of a p-type base layer 202 formed on an n⁺ substrate 201. A trench 213 is formed as deep as 5 µm from the surface of the n⁺ source region 204. An n-type sidewall region 216 is formed by implanting donner type impurity ions from the side and bottom faces of the trench 213. An insulation film 212 of an oxide film etc. is buried in the trench 213 by plasma CVD.

The power device circuit 215 is provided with the same function as that of the first embodiment by connecting the n⁺ source region 204 and the n⁺ substrate 201 via the n-type sidewall region 216, and by disposing a source electrode 210 and a drain electrode 211 on the back and top surfaces of the n⁺ substrate 201. Since the n⁺ source region 204 need not be diffused as deep as 5 µm in the second embodiment, the diffusion time and the device pitch are shortened. Thus, the on-resistance per unit area of the semiconductor substrate is further lowered.

Figure 3:
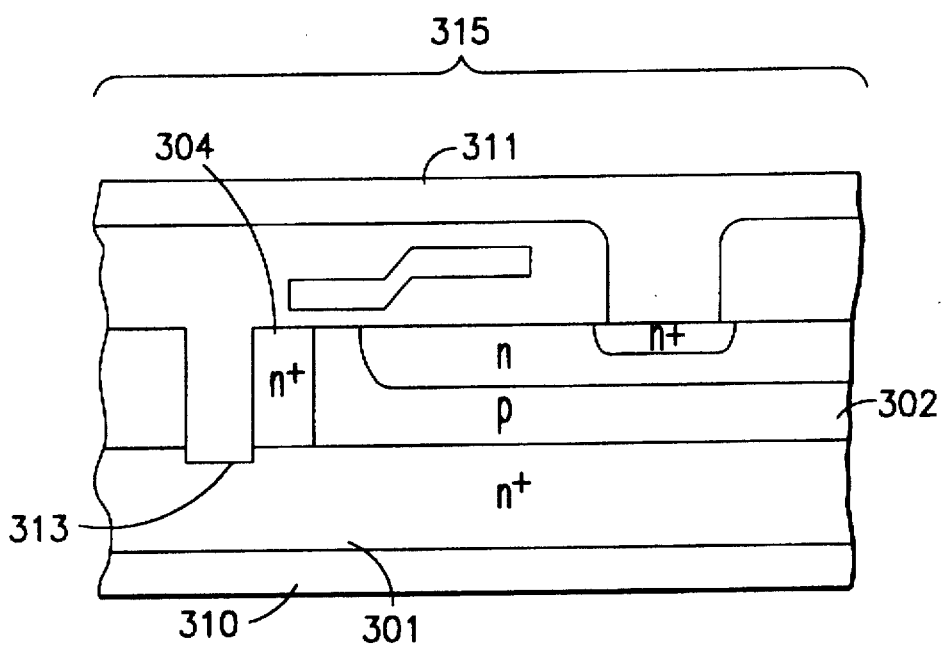
FIG. 3 is a cross section of a third embodiment of a back-source MOSFET according to the present invention.

Referring to FIG. 3, a cross section of a third embodiment of a back-source MOSFET is shown. In a power device circuit 315 shown in FIG. 3, a trench 313 is dug as deep as 5 µm from the surface of the p-type base layer 302. An n⁺ source region 304 is formed by implanting donner type impurity ions from the side and bottom faces of the trench 313. The power device circuit 315 is provided with the same function as that of the first embodiment by connecting the n⁺ source region 304 and the n⁺ substrate 301, and by disposing a source electrode 310 and a drain electrode 311 on the back and top surfaces of the n⁺ substrate 301. In the third embodiment, the n⁺ source region 304 and n-type sidewall region can be formed simultaneously.

Figure 4:
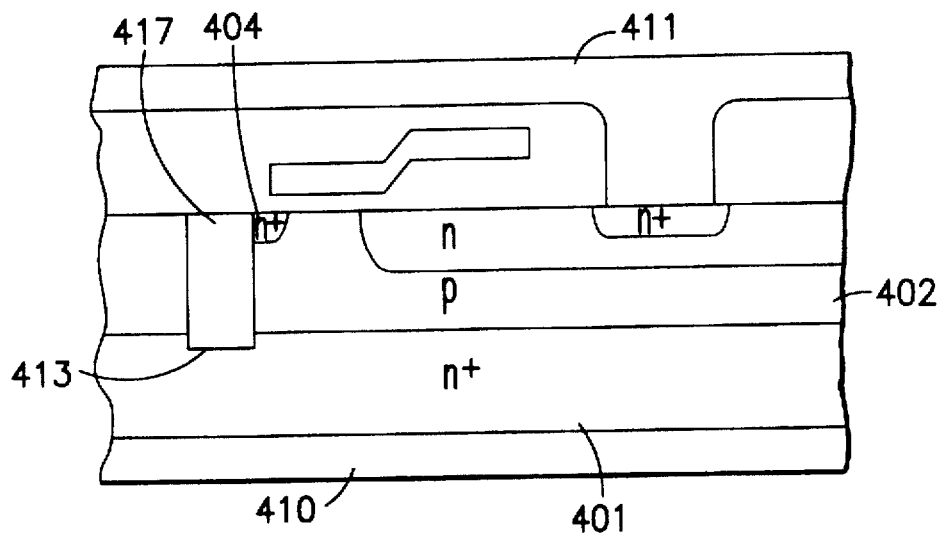
FIG. 4 is a cross section of a fourth embodiment of a back-source MOSFET according to the present invention.

Referring to FIG. 4, a cross section of a fourth embodiment of a back-source MOSFET is shown. As shown in FIG. 4, an n⁺ source region 404 is formed shallowly prior to the trench formation by ion implantation. Then, a trench 413 is formed from the surface of the n⁺ source region 404. The n⁺ source region 404 and an n⁺ substrate 401 are electrically connected with one another by burying an electric conductor 417 in the trench 413. Aluminum alloy or in some cases silicides etc. of metals having a high melting point may be used for the electric conductor 417.

In the embodiments shown in FIGS. 1, 2 and 3, the channel is partially employed for electrically connecting the p-type base layer 102, 202 or 302 with the n⁺ source region 104, 204 or 304. Since the n⁺ source region 404 is electrically connected with the p-type base layer 402 on the side face of the trench 413 as well as with the n⁺ substrate 401 by burying the electric conductor 417, the channel is fully utilized for driving the back-source MOSFET in the fourth embodiment. In the fourth embodiment too, the wiring area is increased, the wiring resistance is greatly reduced, the on-resistance of the MOSFET is lowered, and noise is prevented from being caused.

Figure 5:
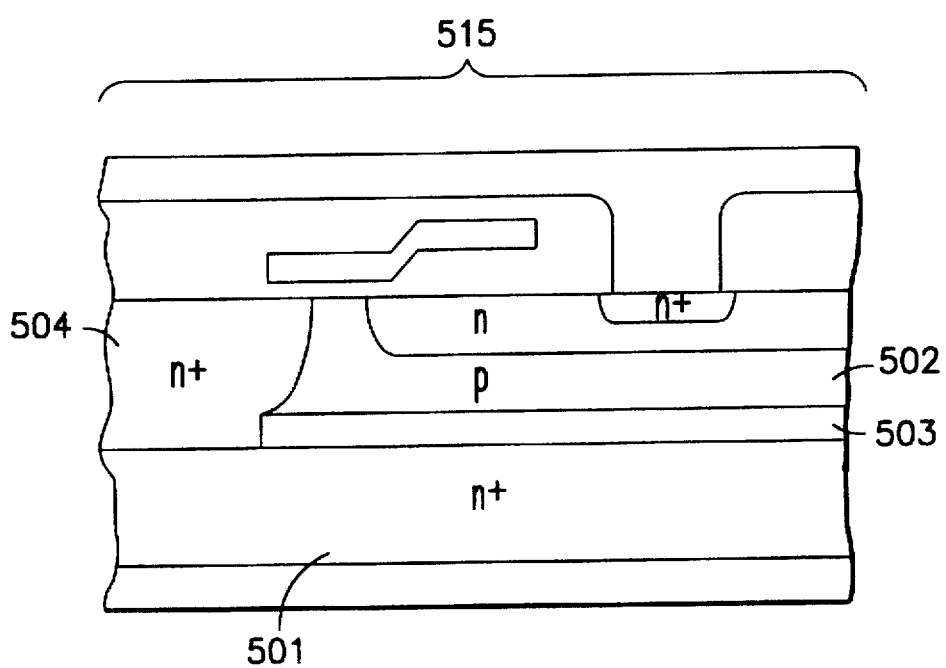
FIG. 5 is a cross section of a fifth embodiment of a back-source MOSFET according to the present invention.

Referring to FIG. 5, a cross section of a fifth embodiment of a back-source MOSFET is shown. Though the fifth embodiment is similar to the first embodiment in the structure thereof, the fifth embodiment is different from the first embodiment in that the fifth embodiment uses a dielectrics-separation type SOI n⁺ substrate 501. An oxide separation film 503 is formed between an n⁺ substrate 501 and a p-type base layer 502. The oxide separation film 503 is not extended below an n⁺ source region 504 so that the n⁺ substrate 501 and the n⁺ source region 504 may be electrically connected. Since the CMOS transistor of a logic circuit (not shown) is formed in the p-type base layer 502 completely isolated by the oxide separation film 503 from the n⁺ substrate 501, which is the source of the MOSFET of the power device circuit 515, the substrate potential of the single-layered logic circuit (not shown) is stabilized. The oxide separation film 503 is not formed on a part of the SOI n⁺ substrate 501. The oxide separation film 503 is obtained by laminating wafers having an oxide film previously patterned thereon or by selectively implanting oxygen ions.

Figure 6:
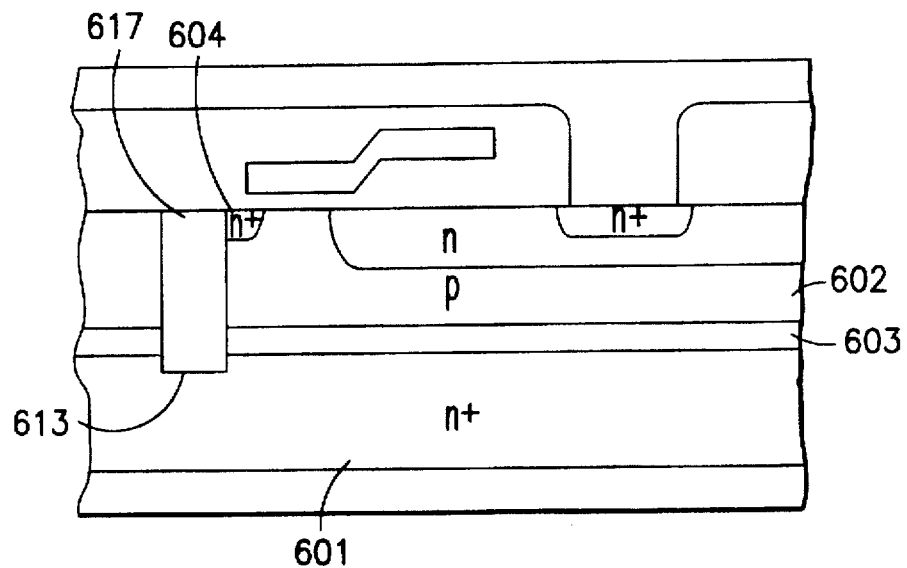
FIG. 6 is a cross section of a sixth embodiment of a back-source MOSFET according to the present invention.

Referring to FIG. 6, a cross section of a sixth embodiment of a back-source MOSFET is shown. In the sixth embodiment, a dielectrics-separation type n⁺ substrate 601 is used. A trench 613 is formed in the same manner as in the fourth embodiment. An n⁺ source region 604 and the n⁺ substrate 601 are connected with one another through an electric conductor 617 buried in the trench 613. Since the CMOS transistor of a logic circuit (not shown) is formed in a p-type base layer 602 completely isolated by the oxide separation film 603 from the n⁺ substrate 601 which is the source of the MOSFET of the power device circuit, the substrate potential of the single-layered logic circuit is stabilized. Since it is not necessary to pattern the oxide separation film 603, the back-source MOSFET is manufactured easily.

Figure 7:
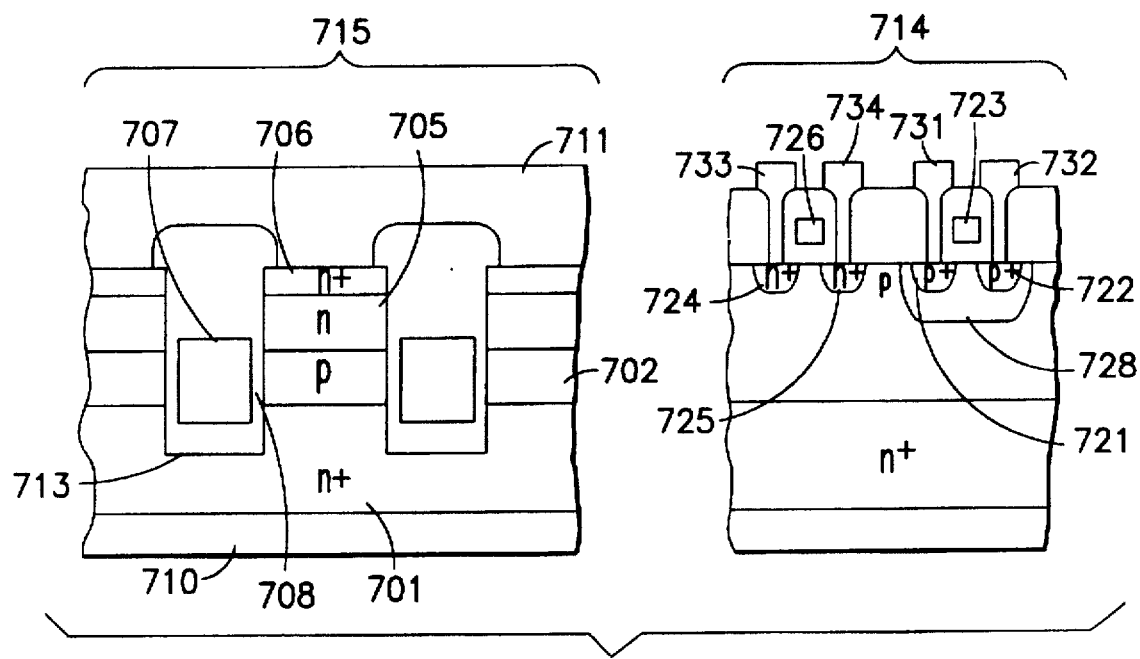
FIG. 7 is a cross section of a power IC into which a seventh embodiment of a back-source MOSFET according to the present invention is incorporated.

Referring to FIG. 7, a cross section of a power IC into which a seventh embodiment of a back-source MOSFET according to the present invention is incorporated is shown. In FIG. 7, a part of the lateral MOSFET of a power device circuit 715 is shown on the left hand side. A CMOS transistor of a logic circuit 714 is shown on the right hand side.

The power device circuit 715 and the logic circuit 714 are formed in a p-type base layer 702, with an impurity concentration of around $5 \times 10^{16}$ cm³ and around 5 µm in thickness, laminated on an n⁺ substrate 701 with an impurity concentration of around $1 \times 10^{20}$ cm³. On the left hand side of FIG. 7, an n-type drain drift region 705 is formed from the substrate surface as deep as 3 µm by ion implantation and subsequent thermal treatment. An n⁺ drain region 706 is formed on the n-type drain drift region 705. Then, a trench 713 is formed as deep as 5.5 µm, and filled with polycrystalline silicon deposited by the reduced pressure CVD method to form a gate electrode 707. The gate electrode 707 is formed so that the gate electrode 707 may face, via a gate oxide film 708, the exposed surface of the p-type base layer 702 exposed to the trench 713. The n⁺ substrate 701 functions as a source region, and an aluminum alloy source electrode 710 is formed on the back surface thereof. A drain electrode 711 is connected to the n⁺ drain region 706. The back-source MOSFET is constituted by these constituent elements.

The source electrode 710 and the drain electrode 711 are electrically connected with one another in the same manner as in the above described embodiments by applying a positive voltage to the gate electrode 707. By the structure of the seventh embodiment, the device pitch is greatly shortened, and the on-resistance per unit area is greatly lowered. Since the source electrode 710 is formed on the back surface of the n⁺ substrate 701, the wiring resistance is reduced and large current output is facilitated.

In the logic circuit 714, an n⁺ source region 724 and an n⁺ drain region 725 are formed in the p-type base layer 702. A source electrode 733 is connected to the n⁺ source region 724. A drain electrode 734 is connected to the n⁺ drain region 725. The p-type base layer 702, the n⁺ source region 724, the n⁺ drain region 725, the source electrode 733, the drain electrode 734, and a gate electrode 726 constitute an n-channel MOSFET.

An n-type well region 728 is formed in the p-type base layer 702. A p⁺ source region 721 and a p⁺ drain region 722 are formed in the n-type well region 728. A source electrode 731 is connected to the p⁺ source region 721. A drain electrode 732 is connected to the p⁺ drain region 722. The n-type well region 728, the p⁺ source region 721, the p⁺ drain region 722, the source electrode 731, the drain electrode 732, and a gate electrode 723 constitute a p-channel MOSFET. The p-channel MOSFET and the n-channel MOSFET constitute a CMOS circuit.

The CMOS constituting the logic circuit 714 is formed on the p-type base layer 702 as shown in FIG. 7. The n⁺ substrate 701, that is also the source of the n-channel MOSFET, is fixed at ground potential, when used on the low voltage side such as in the H-bridge circuit, inverter circuit, etc. Due to this potential scheme, the potential of the p-type base layer 702, that is the substrate of the logic circuit 714, is stabilized to prevent noise from being caused in the logic circuit 714.

In the seventh embodiment of FIG. 7, the n-type drain drift region 705 of the back-source MOSFET may be formed by epitaxial growth. By this method of growing, the impurity concentration is equalized throughout the n-type drain drift region 705, so that the amount of impurity may be increased to further lower the on-resistance.

Figure 8:
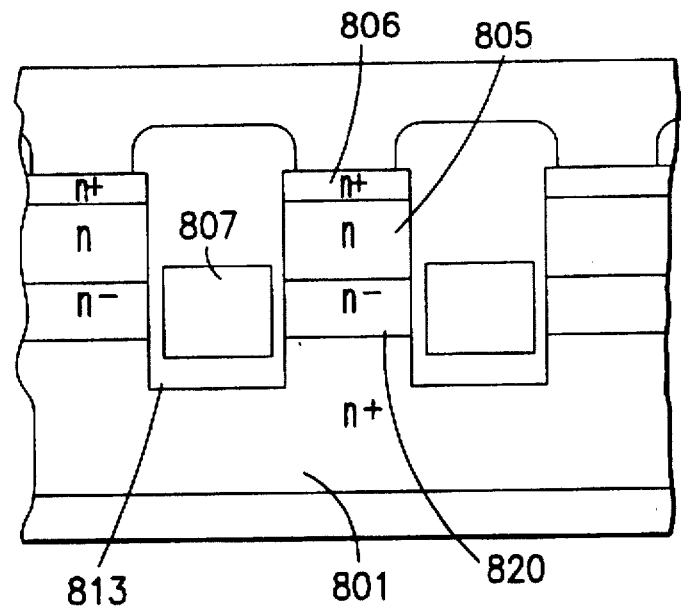
FIG. 8 is a cross section of an eighth embodiment of a back-source MOSFET according to the present invention.

Referring to FIG. 8, a cross section of an eighth embodiment of a back-source MOSFET is shown. Though the eighth embodiment has a similar structure with that of the seventh embodiment of FIG. 7, an n⁻ base layer 820 is formed, in place of the p-type epitaxial layer, by laminating a lightly doped n-type epitaxial layer on an n⁺ substrate 801. An n-type drain drift region 805 and an n⁺ drain region 806 are formed from the surface of the n⁻ base layer 820. This back-source MOSFET is a normally-on type device that is turned off by pulling in the gate voltage to be negative so as to deplete the n⁻ base layer 820 from its surface oppositely facing a gate electrode 807 formed in a trench 813. By the structure of the eighth embodiment, the channel resistance is greatly lowered and further on-resistance lowering is facilitated.

Figure 9:
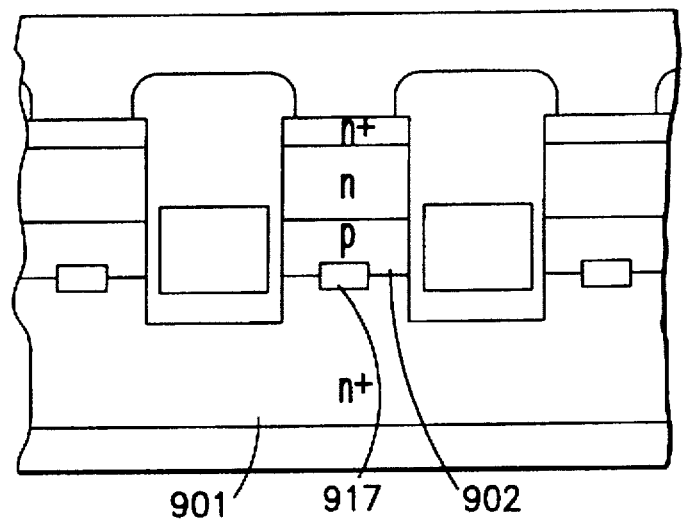
FIG. 9 is a cross section of a ninth embodiment of a back-source MOSFET according to the present invention.
Figure 10:
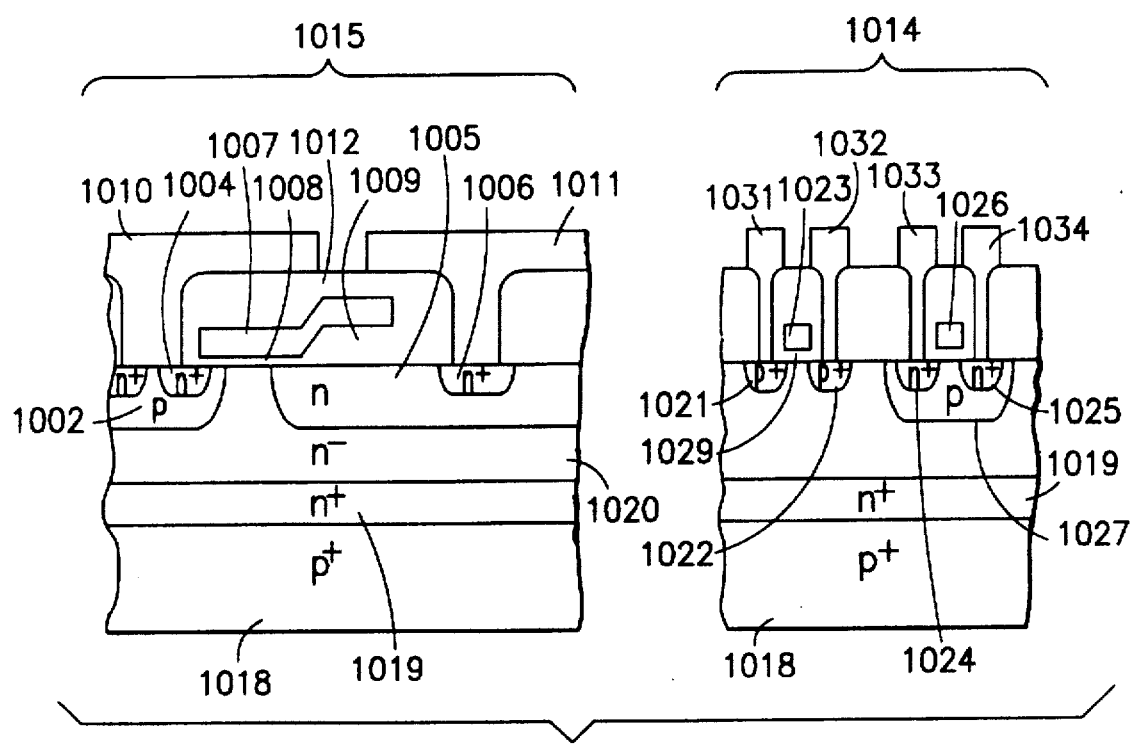
FIG. 10 is a cross section of a power IC according to the prior art.
Figure 11:
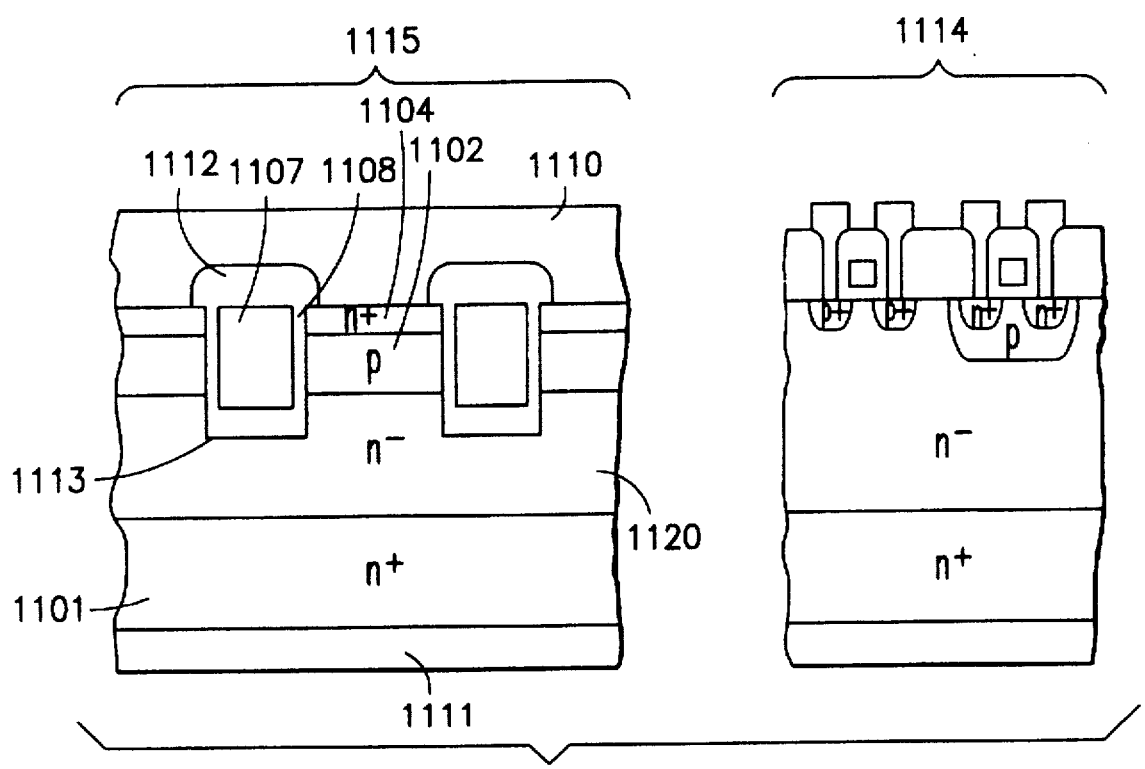
FIG. 11 is a cross section of another power IC according to the prior art.

Referring to FIG. 9, a cross section of a ninth embodiment of a back-source MOSFET is shown. Though the ninth embodiment has a similar structure with that of the seventh embodiment of FIG. 7, an electric conductor 917 is buried between an n⁺ substrate 901 and a p-type base layer 902. The potential of the p-type base layer 902 is stabilized by electrically connecting the n⁺ substrate 901 and the p-type base layer 902 via the electric conductor 917. Polycrystalline silicon or silicides of metals having a high melting point are used for the electric conductor 917.

Though the present invention has been explained by way of n-channel MOSFET's formed in a p-type base layer formed on an n-type substrate, it is obvious to those skilled in the art that the present is applicable to p-channel MOSFET's formed in an n-type base layer laminated on a p-type substrate.

The back-source MOSFET's according to the present invention exhibit these following effects. By forming the source and drain electrodes separately on the respective major surfaces of the wafer, the wiring pattern is simplified and the wiring resistance is greatly lowered. By electrically connecting the substrate and the source region with one another, and by forming the source electrode on the back surface of the substrate, the substrate potential is stabilized and noise is prevented from being caused in the logic circuit of the power IC.

Especially, by the employment of the trench, the area for electrically connecting the source region and the substrate is narrowed to its minimum, and the time spent for forming the diffusion layer for the short circuit is shortened. By employing the dielectrics-separation structure, noise propagation to the logic circuit is further suppressed.

By employing the trench- and dielectrics-separation simultaneously, the above described effects are combined with one another.

Low on-resistance and low noise are realized also by employing the trench MOSFET structure that uses the substrate as the source region to facilitate denser device integration.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A back-source MOSFET comprising:
   a semiconductor substrate of a first conductivity type;
   a base layer of a second conductivity type on a first surface of said semiconductor substrate;
   a source region of said first conductivity type in said base layer;
   said source region extending in said base layer to contact said semiconductor substrate;
   a drain drift region of said first conductivity type in said base layer;
   a drain region of said first conductivity type in said drain drift region;
   a gate electrode on a portion of said base layer;
   a gate insulation film interposed between said portion of said base layer extending between said source region and said drain drift region;
   a drain electrode connected to said drain region;
   a source electrode on a second surface of said semiconductor substrate; and
   said source electrode being connected to said source region.

2. The back-source MOSFET of claim 1, wherein said source region includes a diffusion layer extending from a surface of said base layer to said semiconductor substrate.

3. The back-source MOSFET of claim 2, further comprising a CMOS logic circuit, said CMOS logic circuit being formed in said base layer.

4. The back-source MOSFET of claim 1, further comprising:
   a trench from a surface of said source region; and
   a diffusion layer including impurity ions diffused from an inner face of said trench, whereby said source region and said semiconductor substrate are connected with one another via said diffusion layer.

5. The back-source MOSFET of claim 4, further comprising a CMOS logic circuit, said CMOS logic circuit being formed in said base layer.

6. The back-source MOSFET of claim 1, further comprising a CMOS logic circuit, said CMOS logic circuit being formed in said base layer.

7. A back-source MOSFET comprising:
   a semiconductor substrate of a first conductivity type;
   a base layer of a second conductivity type on a first surface of said semiconductor substrate;
   a source region of said first conductivity type in said base layer;

said source region disposed in said base layer on an opposing side from said semiconductor substrate;

a trench from a surface of said source region to said semiconductor substrate;

a conductor in said trench, whereby said source region and said semiconductor substrate are connected with one another via said conductor;

a drain drift region of said first conductivity type in said base layer;

a drain region of said first conductivity type in said drain drift region;

a gate electrode on a portion of said base layer;

a gate insulation film interposed between said portion of said base layer extending between said source region and said drain drift region;

a drain electrode connected to said drain region;

a source electrode on a second surface of said semiconductor substrate;

said source electrode being connected to said source region.

8. The back-source MOSFET of claim 7, wherein said conductor further connects said source region and said semiconductor substrate.

9. The back-source MOSFET of claim 8, further comprising a CMOS logic circuit, said CMOS logic circuit being formed in said base layer.

10. The back-source MOSFET of claim 7, further comprising a CMOS logic circuit, said CMOS logic circuit being formed in said base layer.

11. A back-source MOSFET comprising:

a semiconductor substrate of a first conductivity type;

a base layer of a second conductivity type on a first surface of said semiconductor substrate;

an insulation film on at least a part of a boundary between said semiconductor substrate and said base layer;

a source region of said first conductivity type in said base layer;

said source region extending in said base layer to contact said semiconductor substrate;

a drain drift region of said first conductivity type in said base layer;

a drain region of said first conductivity type in said drain drift region;

a gate electrode on a portion of said base layer;

a gate insulation film interposed between said portion of said base layer extending between said source region and said drain drift region;

a drain electrode connected to said drain region;

a source electrode on a second surface of said semiconductor substrate; and said source electrode being connected to said source region.

12. The back-source MOSFET of claim 11, further comprising a CMOS logic circuit, said CMOS logic circuit being formed in said base layer.

13. A back-source MOSFET comprising:

a semiconductor substrate of a first conductivity type;

a base layer of a second conductivity type on a first surface of said semiconductor substrate;

an insulation film on at least a part of a boundary between said semiconductor substrate and said base layer;

a source region of said first conductivity type in said base layer;

said source region extending in said base layer to contact said semiconductor substrate;

said source region including a diffusion layer extending from a surface of said base layer to said semiconductor substrate;

a drain drift region of said first conductivity type in said base layer;

a drain region of said first conductivity type in said drain drift region;

a gate electrode on a portion of said base layer;

a gate insulation film interposed between said portion of said base layer extending between said source region and said drain drift region;

a drain electrode connected to said drain region;

a source electrode on a second surface of said semiconductor substrate; and said source electrode being connected to said source region.

14. A back-source MOSFET comprising:

a semiconductor substrate of a first conductivity type;

a base layer of a second conductivity type on a first surface of said semiconductor substrate;

an insulation film on at least a part of a boundary between said semiconductor substrate and said base layer;

a source region of said first conductivity type in said base layer;

said source region extending in said base layer to contact said semiconductor substrate;

a trench from a surface of said source region to said semiconductor substrate;

a diffusion layer including impurity ions diffused from an inner face of said trench, whereby said source region and said semiconductor substrate are connected with one another via said diffusion layer;

a drain drift region of said first conductivity type in said base layer;

a drain region of said first conductivity type in said drain drift region;

a gate electrode on a portion of said base layer;

a gate insulation film interposed between said portion of said base layer extending between said source region and said drain drift region;

a drain electrode connected to said drain region;

a source electrode on a second surface of said semiconductor substrate; and said source electrode being connected to said source region.

15. A back-source MOSFET comprising:

a semiconductor substrate of a first conductivity type;

a base layer of a second conductivity type on a first surface of said semiconductor substrate;

an insulation film on at least a part of a boundary between said semiconductor substrate and said base layer;

a source region of said first conductivity type in said base layer;

said source region disposed in said base layer on an opposite side from said semiconductor substrate;

a trench from a surface of said source region to said semiconductor substrate;

a conductor in said trench whereby said source region and said semiconductor substrate are connected with one another via said conductor;

a drain drift region of said first conductivity type in said base layer;

a drain region of said first conductivity type in said drain drift region;

a gate electrode on a portion of said base layer;

a gate insulation film interposed between said portion of said base layer extending between said source region and said drain drift region;

a drain electrode connected to said drain region;

a source electrode on a second surface of said semiconductor substrate;

said source electrode being connected to said source region.

16. A back-source MOSFET comprising:

a semiconductor substrate of a first conductivity type;

a base layer of a second conductivity type on a first surface of said semiconductor substrate;

an insulation film on at least a part of a boundary between said semiconductor substrate and said base layer;

a source region of said first conductivity type in said base layer;

said source region disposed in said base layer on an opposite side from said semiconductor substrate;

a trench extending from a surface of said source region to said semiconductor substrate;

a conductor in said trench whereby said source region and said semiconductor substrate are connected with one another via said conductor;

said conductor further connecting said source region and said semiconductor substrate;

a drain drift region of said first conductivity type in said base layer;

a drain region of said first conductivity type in said drain drift region;

a gate electrode on a portion of said base layer;

a gate insulation film interposed between said portion of said base layer extending between said source region and said drain drift region;

a drain electrode connected to said drain region;

a source electrode on a second surface of said semiconductor substrate;

said source electrode being connected to said source region.

17. A back-source MOSFET comprising a semiconductor substrate of a first conductivity type;

a base layer of a second conductivity type on a first surface of said semiconductor substrate;

a drain drift region of said first conductivity type on said base layer;

a drain region on said drain drift region;

a trench from a surface of said drain region at least to said semiconductor substrate;

a conductor, disposed between said base layer and said semiconductor substrate whereby said semiconductor substrate and said base layer are connected with one another by said conductor;

a gate electrode in said trench;

a gate oxide film between said gate electrode and said base layer;

said gate electrode and said base layer facing opposite surfaces of said gate oxide film;

a source electrode on a second surface of said semiconductor substrate; and a drain electrode connected to said drain region.

18. The back-source MOSFET of claim 17, further comprising a CMOS logic circuit, said CMOS logic circuit being formed in said base layer.

19. A back-source MOSFET comprising:

a semiconductor substrate of a first conductivity type;

a base layer of said first conductivity type on a first surface of said semiconductor substrate;

a drain drift region of said first conductivity type formed directly on said base layer;

a drain region on said drain drift region;

a trench from a surface of said drain region at least to said semiconductor substrate;

a gate electrode in said trench;

a gate oxide file between said gate electrode and said base layer;

said gate electrode and said base layer facing opposite surfaces of said gate oxide film;

a source electrode on a second surface of said semiconductor substrate; and a drain electrode connected to said drain region;

whereby a normally-on switch is formed.

20. The back-source MOSFET of claim 19, further comprising a CMOS logic circuit, said CMOS logic circuit being formed in said base layer.

* * * * *